(12) United States Patent
Okagawa et al.

(10) Patent No.: US 7,842,988 B2
(45) Date of Patent: Nov. 30, 2010

(54) MANUFACTURING METHOD OF PHOTOELECTRIC CONVERSION DEVICE

(75) Inventors: Takashi Okagawa, Sagamihara (JP); Hiroaki Naruse, Yokohama (JP); Hiroshi Yuzurihara, Atsugi (JP); Shigeru Nishimura, Ebina (JP); Takeshi Aoki, Yokohama (JP); Yuya Fujino, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/784,567

(22) Filed: May 21, 2010

(65) Prior Publication Data

US 2010/0230728 A1    Sep. 16, 2010

Related U.S. Application Data

(62) Division of application No. 11/840,583, filed on Aug. 17, 2007, now Pat. No. 7,749,788.

(30) Foreign Application Priority Data

| Aug. 31, 2006 | (JP) | ............................. 2006-235936 |
| Aug. 31, 2006 | (JP) | ............................. 2006-236760 |
| Jul. 20, 2007 | (JP) | ............................. 2007-189447 |

(51) Int. Cl.
    *H01L 21/00* (2006.01)
(52) U.S. Cl. ................. 257/292; 257/159; 257/E27.133
(58) Field of Classification Search ................. 257/115, 257/123, 157, 159, 160, 233, 292, E27.133
    See application file for complete search history.

(56) References Cited

U.S. PATENT DOCUMENTS

| 5,814,886 | A | 9/1998 | Mano ......................... 257/734 |
| 6,169,317 | B1 | 1/2001 | Sawada et al. .............. 257/435 |
| 7,126,102 | B2 | 10/2006 | Inoue et al. ............. 250/214 R |
| 7,259,361 | B2 | 8/2007 | Nishimura ............... 250/208.1 |
| 2006/0043442 | A1 | 3/2006 | Yuzurihara et al. .......... 257/292 |
| 2006/0118795 | A1 | 6/2006 | Araki .......................... 257/83 |
| 2006/0172450 | A1 | 8/2006 | Tazoe et al. ................... 438/57 |
| 2007/0262366 | A1* | 11/2007 | Baek et al. .................. 257/292 |

FOREIGN PATENT DOCUMENTS

| JP | 9-55440 A | 2/1997 |
| JP | 2002-368203 A | 12/2002 |

* cited by examiner

*Primary Examiner*—Thanhha Pham
(74) *Attorney, Agent, or Firm*—Fitzpatrick, Cella, Harper & Scinto

(57) ABSTRACT

A noise generated by a constitution of widening an incident aperture of light of a photoelectric conversion element is reduced. In a manufacturing method of a photoelectric conversion device, first electroconductor arranged in a first hole arranged in the first interlayer insulation layer electrically connects a first semiconductor region to a gate electrode of an amplifying MOS transistor not through wirings included in a wiring layer. Moreover, a second electroconductor electrically connects a second semiconductor region different from the first semiconductor region to a wiring. In a constitution of that second electroconductor, a third electroconductor arranged in a second hole arranged in the first interlayer insulation layer and a fourth electroconductor arranged in a third hole arranged in the second interlayer insulation layer are stacked and electrically connected to each other. And the step of forming the first electroconductor, and the step of forming the third electroconductor are performed simultaneously.

11 Claims, 9 Drawing Sheets

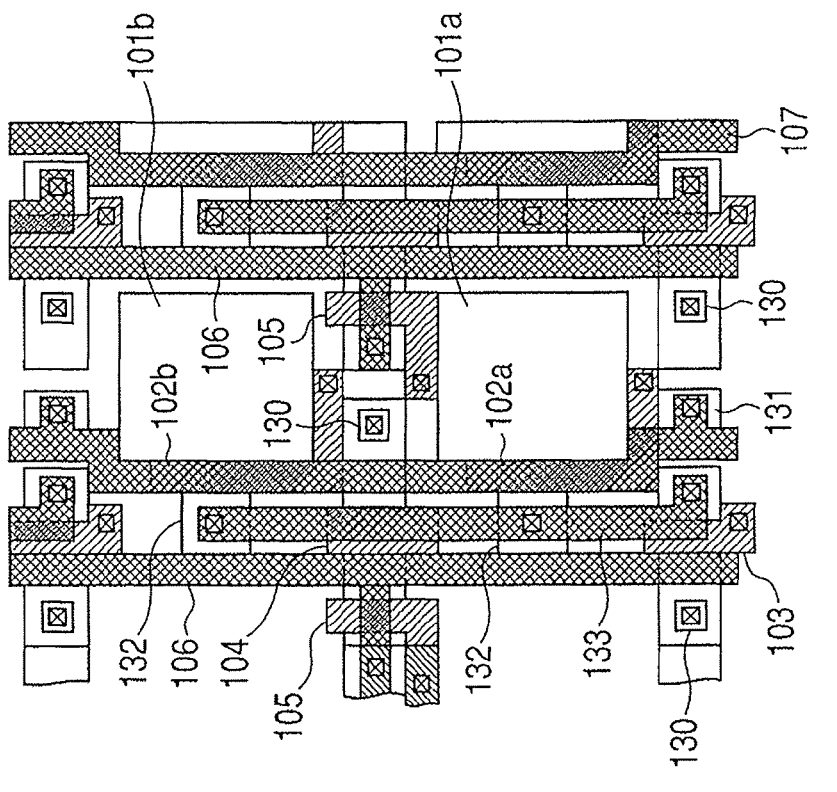
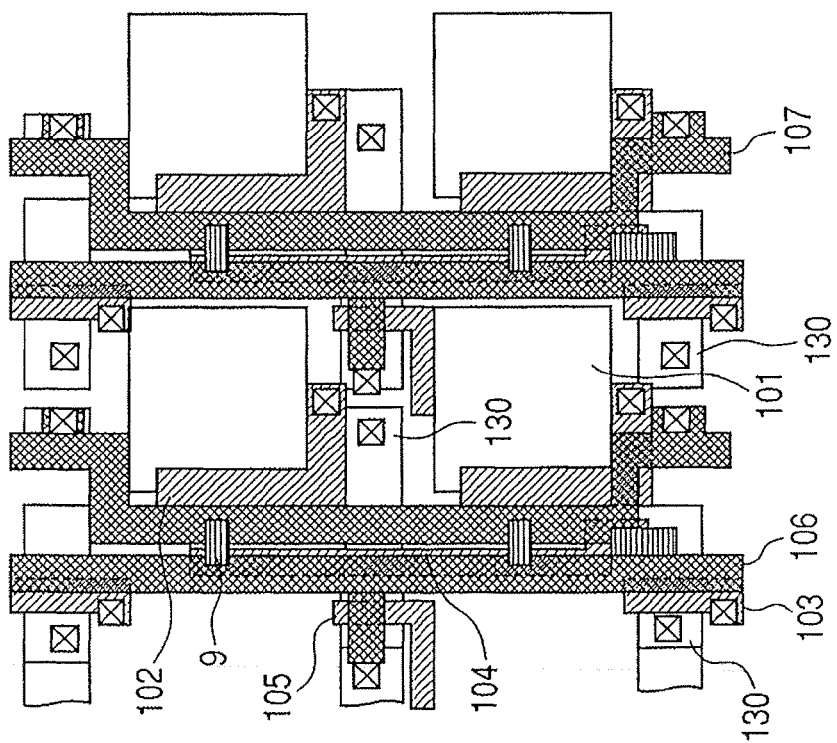

MANUFACTURING METHOD OF PHOTOELECTRIC CONVERSION DEVICE

CROSS REFERENCE TO RELATED APPLICATION

This application is a division of U.S. application Ser. No. 11/840,583, filed on Aug. 17, 2007, the entire disclosure of which is hereby incorporated by reference herein.

BACKGROUND OF THE INVENTION

1. Field of the Invention

The present invention relates to a manufacturing method of a photoelectric conversion device.

2. Description of the Related Art

In recent years, inexpensive digital cameras and video cameras providing high image quality have become widespread. The photoelectric conversion device used in digital cameras and video cameras includes a CCD type and a MOS type photoelectric conversion device. A MOS type photoelectric conversion device includes a photoelectric conversion region including a MOS transistor and a photodiode and a peripheral circuit region including a MOS transistor outputting signals of the photoelectric conversion region and driving the MOS transistor arranged in the photoelectric conversion region. Those photoelectric conversion region and peripheral circuit region can be manufactured through a common step by a CMOS manufacturing process.

Japanese Patent Application Laid-Open No. H09-055440 describes contact structure used at an occasion of manufacturing an SRAM by the CMOS manufacturing process. Specifically, in structure, a semiconductor region is electrically connected to a gate electrode with an electroconductor buried in a hole arranged in an interlayer insulation layer and a plurality of layers of an electroconductor arranged in a hole arranged in an interlayer insulation layer are stacked. In addition, Japanese Patent Application Laid-Open No. 2002-368203 discloses, in a source follower circuit present in a peripheral circuit region of a CCD type photoelectric conversion device, a constitution of electrically connecting a semiconductor region to a gate electrode with an electroconductor buried in a hole arranged in an interlayer insulation layer.

A MOS photoelectric conversion device requires more wiring layers in number than a CCD photoelectric conversion device since one pixel includes a photoelectric conversion element and a plurality of MOS transistors. Here, a light incident aperture of the photoelectric conversion element is defined by the wiring layer. Accordingly, in order to increase optical incidence efficiency to improve sensitivity, a wiring layout for widening the aperture for optical incidence to the photoelectric conversion element will be required.

In order to widen the aperture, in a photoelectric conversion region where a photoelectric conversion element of a MOS photoelectric conversion device is arranged, present inventor has found out to adopt a constitution to electrically connect a semiconductor region to a gate electrode with an electroconductor buried in a hole arranged in an interlayer insulation layer. And, at some occasion of manufacturing a photoelectric conversion device in such a constitution, noises were found to occasionally increase.

Therefore, an object of the present invention is to restrain noise increase being the above described newly found problem and to provide a manufacturing method of a MOS photoelectric conversion device which has been improved in efficiency of optical incidence to a photoelectric conversion element.

SUMMARY OF THE INVENTION

A manufacturing method of a photoelectric conversion device of the present invention is a manufacturing method of a photoelectric conversion device including: a plurality of photoelectric conversion elements arranged on a semiconductor substrate: and a transfer MOS transistor for transferring an electric carrier of the photoelectric conversion element to a first semiconductor region, and an amplifying MOS transistor for reading out a signal based on the electric carrier transferred, including steps of: forming the photoelectric conversion element, the first semiconductor region, the transfer MOS transistor and the amplifying MOS transistor on a semiconductor substrate; forming a first interlayer insulation layer covering the photoelectric conversion element, the transfer MOS transistor and the amplifying MOS transistor; forming a single hole in the first interlayer insulation layer to expose a region including a part of a gate electrode of the amplifying MOS transistor and a part of the first semiconductor region; forming a hole in the first interlayer insulation layer to expose a region including a part of an electrode of the amplifying MOS transistor and a part of the first semiconductor region; burying in the single hole a first electroconductor; burying a second electroconductor in the hole arranged corresponding to the region including at least a part of an electrode region of the amplifying MOS transistor; and forming a second interlayer insulation layer covering the first and second electroconductors; forming a hole in the second interlayer insulation layer correspondingly to a region including at least a part of the second electroconductors; burying a third electroconductor in the hole arranged corresponding to the region including at least a part of the second electroconductors; and forming, on the third electroconductor, a wiring electrically connected to the third electroconductor, wherein the step of burying the first electroconductor, and the step of burying the second electroconductor are performed simultaneously.

In addition, a manufacturing method of a photoelectric conversion device of the present invention is a manufacturing method of a photoelectric conversion device including: and a photoelectric conversion element, and a plurality of MOS transistors including a transfer MOS transistor for transferring a electric carrier of the photoelectric conversion element to a first semiconductor region and an amplifying MOS transistor for reading out a signal based on the electric carrier transferred, being arranged in a semiconductor substrate; and a wiring layer including a plurality of wirings, a plurality of interlayer insulation layers including a first interlayer insulation layer arranged to cover the photoelectric conversion element and the plurality of MOS transistors, and a second interlayer insulation layer laminated on the first interlayer insulation layer, being arranged on a semiconductor substrate, wherein the photoelectric conversion device further includes first and second electroconductors, the first electroconductor is buried in a first hole arranged in the first interlayer insulation layer, the second electroconductor for electrically connecting the first semiconductor region to a gate electrode of the amplifying MOS transistor not through the wirings included in the wiring layer electrically connects a second semiconductor region different from the first semiconductor region to a first wiring included in the wiring layer and includes a third electroconductor buried in a second hole arranged in the first interlayer insulation layer and a fourth electroconductor buried in a third hole arranged in the second interlayer insulation layer stacked and electrically connected to each other, wherein the step of burying the first electroconductor, and the step of burying the second electroconductor are the same step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5A is a plan layout view of a photoelectric conversion device and FIG. 5B is a plan layout view of photoelectric conversion device for comparison.

Figure 1:
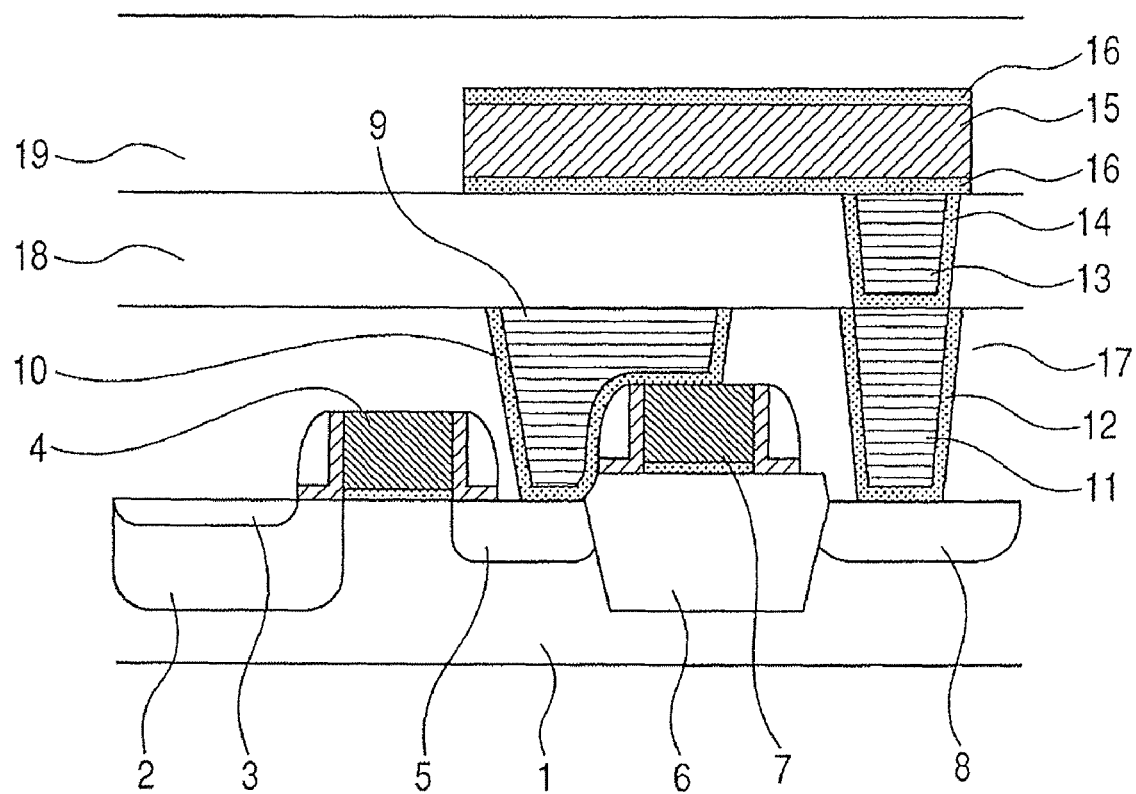
FIG. 1 is a schematic section of a photoelectric conversion device of a first embodiment.

The accompanying drawings, which are incorporated in and constitute a part of the specification, illustrate embodiments of the invention and, together with the description, serve to explain the principles of the invention.

DESCRIPTION OF THE EMBODIMENTS

A photoelectric conversion device of the present invention includes a plurality of photoelectric conversion elements arranged on a semiconductor substrate, a plurality of MOS transistors and wiring arranged on the semiconductor substrate. Those MOS transistors include at least transfer MOS transistor which transfers electric carriers of the photoelectric conversion element to a first semiconductor region and an amplifying MOS transistor which reads signals based on transferred electric carriers. The photoelectric conversion device includes a first interlayer insulation layer arranged on a semiconductor substrate covering the photoelectric conversion element and a plurality of the MOS transistors and a second interlayer insulation layer stacked on the first interlayer insulation layer. In such a photoelectric conversion device, the first electroconductor buried in the first hole arranged on the first interlayer insulation layer is used to electrically connect the first semiconductor region to the gate electrode of the amplifying MOS transistor through no wiring. Moreover, a second semiconductor region different from the first semiconductor region is electrically connected to wiring by the second electroconductor. Here, the second electroconductor is structured by stacking and electrically connecting a third electroconductor buried in a second hole arranged in the first interlayer insulation layer and a fourth electroconductor buried in a third hole arranged in the second interlayer insulation layer. And that third electroconductor is buried in each hole through the same step as the step for the first electroconductor.

Such constitution will enable electrical connection between the first semiconductor region and the gate electrode without wiring and therefore decreases in the quantity of required wiring and improves the degree of freedom in designing wiring and can improve the aperture ratio of a photoelectric conversion element. And, the first electroconductor and the third electroconductor are formed through the same step. Thereby diffusion of metal impurity to the semiconductor region decreases to enable simplification of the manufacturing step. Accordingly, while decreasing in increase in noise, it will be enabled to widen the aperture of a photoelectric conversion device to enable provision of a photoelectric conversion device with improved signal-to-noise ratio.

In addition, the first electroconductor and the third electroconductor have the same height so that planarization of an interlayer insulation layer arranged on the first electroconductor and the third electroconductor will become easy. In addition, an interlayer insulation layer can be thinned. Therefore the incident light path to a photoelectric conversion element can be shortened. And light entering the photoelectric conversion element can be increased more.

Next, generation of noise due to the above described metal impurity will be described. In general, in a photoelectric conversion device, metal impurity diffuses in an active region (semiconductor region) to increase dark current to generate a noise and give rise to variation in signals of each pixel. In particular, in the case where metal impurity diffuses in the periphery of the photoelectric conversion element, properties of the photoelectric conversion element will remarkably decrease. Noises due to metal impurity will significantly influence image qualities. Therefore there will be, in particular, problem in the photoelectric conversion device.

Here, in the steps for forming the above described first electroconductor, such a case is considered that the first electroconductor is formed on a first interlayer insulation layer and thereafter a hole for electrical connection portion in another region is formed in the first interlayer insulation layer. In that case, in the step for forming a hole, a semiconductor substrate is exposed in a metal atmosphere after forming the first electroconductor, metal occasionally diffuses in the substrate. The present invention is attained in view of problems typical to such a photoelectric conversion device.

Next, an electroconductor bringing respective regions into electrical connection will be described. There exist two kinds of electroconductor arranged in a hole arranged in an interlayer insulation layer according to an object brought into electrical connection. One is a contact plug to electrically connect an active region to an electroconductor such as wiring or a gate electrode to an electroconductor such as wiring. The other one is a via plug to electrically connect a contact plug to wiring or wirings themselves. Here, structure of bringing different regions and members into electrical connection only with a plug not through wirings will be hereinafter referred to as shared contact construction. In addition, at an occasion of bringing different regions and members into electrical connection, a plurality of plugs are stacked to come into electrical connection will be hereinafter referred to stacked contact structure (stack via). Accordingly, structure including the above described first electroconductor can be called shared contact structure. Structure including the second electroconductor can be called as stacked (stacked via) contact. Moreover, barrier film can be arranged between a hole and an electroconductor. The barrier film is provided in an attempt to restrain alloy reaction between the interlayer insulation layer, the substrate and the like and the electroconductor or restrain diffusion of the electroconductor to the interlayer insulation layer, the substrate and the like. In a likewise attempt, barrier film can be provided to the upper portion and the lower portion of the wiring as well.

Next, an aperture of a photoelectric conversion device will be described. An aperture refers to a region where light is allowed to enter a photoelectric conversion element and is generally defined by a pattern of wiring and light shielding film. The pattern stipulating the aperture is to determine an outer circumference of light entering the photoelectric conversion element, and optical simulation and the like of the section of the photoelectric conversion device will bring into knowledge which pattern determines the aperture.

Hereinafter, a semiconductor substrate being a material substrate will be referred to as "substrate" and includes a case where a material substrate as described below undergoes treatment. For example, a member in the state where one or a plurality of semiconductor regions and the like are formed, or a member midway a series of manufacturing steps or a member subjected to a series of manufacturing steps can be referred to as substrate as well. An active region refers to a semiconductor region partitioned by an element isolation region formed by a LOCOS and the like or a region where a various elements are formed or configuring a part of an element. For example, a drain region and a source region in a transistor are included. Embodiments of the present invention will be described in detail with reference to the drawings as follows.

(Circuit Constitution of Photoelectric Conversion Device)

Figure 6:
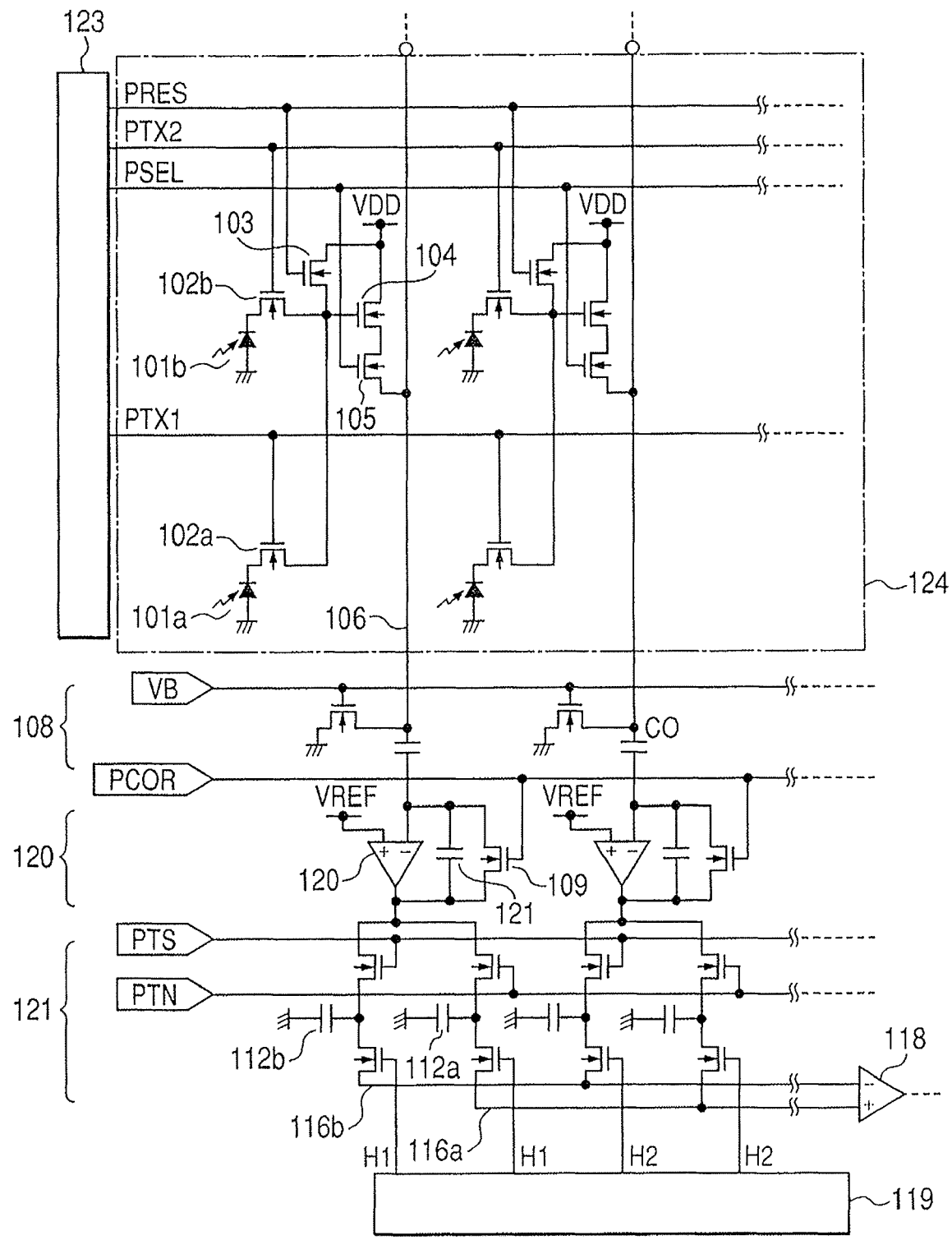
FIG. 6 is an example of a circuit of a photoelectric conversion device.

At first, a circuit of a MOS photoelectric conversion device to which the present invention is applicable will be described. FIG. 6 exemplifies a circuit of a MOS photoelectric conversion device. Transfer MOS transistors 102a and 102b transfer electric carriers of the photoelectric conversion elements. In the present embodiment, electrons among electric carriers generated in a photoelectric conversion element are treated as signal electric carriers. In addition, the transfer MOS transistor is an N type. A reset MOS transistor 103 resets the photoelectric conversion elements 101a and 101b and the drain region of the transfer MOS transistor. In addition, an amplifying MOS transistor 104 amplifies signals based on electric carrier generated in the photoelectric conversion element and outputs the signals to a signal line 106. The amplifying MOS transistor is adapted as a part of a source follower circuit and the drain region thereof is supplied with power source voltage. A selection MOS transistor 105 controls reading to a signal line. The transfer transistor, the reset transistor, the amplifying MOS transistor and a selection MOS transistor will be inclusively referred to as reading MOS transistors. In FIG. 6, the reset MOS transistor 103, the amplifying MOS transistor 104 and the selection MOS transistor 105 included in that reading MOS transistor are shared with the two photoelectric conversion elements 101a and 101b. The photoelectric conversion element is arranged in the photoelectric conversion region 124.

Moreover, a clump circuit 108, a cascade amplifier portion 120 and a signal retaining portion 121 adapted to include clump capacity are provided on each signal line 106. The signal retaining portion 121 is adapted to include capacitors 112a and 112b, a switch and the like. Scan circuits 123 and 129 are included. Signals generated in the photoelectric conversion elements 101a and 101b are read from the signal output line 106 by a read transistor driven by the scan circuit 123 and are output to horizontal output lines 116a and 116b through the clump circuit 108 and the signal retaining portion 121. The signals of the horizontal output lines 116a and 116b are finally output from a differential amplifier 118. Noise components are removed from signals in the clump circuit 108 and the differential amplifier 118 to become image signals. In FIG. 6, the portions such as the scan circuit and the clump circuit besides the photoelectric conversion region 124 are collectively referred to as a periphery circuit region.

Taking embodiments, a constitution of the present invention will be described below. However, the present invention will not be limited to those embodiments but can be appropriately modified within a range not to exceed the gist of the invention.

First Embodiment

In the present embodiment, shared contact structure is employed for a first electroconductor bringing the semiconductor region (first semiconductor region) where electric carrier generated in the photoelectric conversion element are transferred and the gate electrode of the amplifying MOS transistor into electrical connection. Moreover, stacked contact structure is employed for electrically connecting the other MOS transistors and the wiring.

Specific description will be followed below with FIG. 1. FIG. 1 is a schematic section of a pixel of a photoelectric conversion device of a first embodiment. FIG. 1 corresponds to the portion including the photoelectric conversion element 101 and the transfer MOS transistor 102 in FIG. 6. In FIG. 1, a semiconductor region 1 of a first electroconductor type is provided on one main plane of the substrate. That semiconductor region 1 can be one of a well and a substrate of the first electroconductor type. A photoelectric conversion element includes a semiconductor region 2 of a second electroconductor type. A semiconductor region 3 of the first electroconductor type covers the semiconductor region 2. A gate electrode 4 of the transfer MOS transistor transfers electric carriers of the photoelectric conversion element. The electric carriers of the photoelectric conversion element are transferred to a semiconductor region 5 (hereinafter to be referred to as a floating diffusion region, that is, FD region) of the second electroconductor type. An element isolation region 6 is an STI (Shallow Trench Isolation) structure in the present embodiment. The source follower circuit includes a gate electrode 7 of the amplifying MOS transistor. An active region (semiconductor region) 8 in the pixel is connected to the wiring. The active region connected to the wiring is an electrode region, for example, selected from the group including of the source region, the drain region and the like of the above described read MOS transistor. Otherwise, there is a well contact for supplying the well with voltage. In addition, the gate electrode includes the case of being integrated with wirings connecting FD regions to each other and wirings supplying the gate electrode with voltage.

A first electroconductor 9 electrically connects the FD region 5 to the gate electrode 7 of the amplifying MOS transistor. The first electroconductor is arranged in a single contact hole (first hole) arranged in the first interlayer insulation layer 17. The first electroconductor brings the gate electrode 7 and the FD region 5 into electrical connection not through wirings.

The second electroconductors 11 and 13 electrically connect the active region 8 to the wiring 15. The second electroconductor includes a third electroconductor and a fourth electroconductor stacked and brought into electrical connection. That third electroconductor 11 is arranged in a second hole arranged in the first interlayer insulation layer 17. The fourth electroconductor 13 is arranged in a third hole arranged in the second interlayer insulation layer 18. Barrier film 10, 12 and 14 is arranged between an electroconductor and an interlayer insulation layer. In addition, barrier film 16 is arranged in the upper and the lower portions of the wiring 15. Interlayer insulation layers 17, 18 and 19 insulate the wiring, contact and the like.

The gate electrode 7 coming into electrical connection with the first electroconductor is arranged over the element isolation region 6. That element isolation region 6 is desirably STI structure. For example, in the case where the element isolation region is LOCOS structure, etching at an occasion of forming a hole where the first electroconductor is arranged damages a bird's beak portion of the LOCOS structure to increase a leakage current. In addition, the LOCOS structure is higher than the STI structure in height from a substrate and, therefore, process control at the time of forming a hole is difficult. Accordingly, the element isolation region can be STI structure. Here, the gate electrode 7 arranged over the element isolation region 6 can function as wiring.

Here, for the purpose of comparison, structure in which the gate of the amplifying MOS transistor and the FD region are brought into electrical connection through two electroconductors and wiring will be described with FIG. 4. There are provided an electroconductor 26, an electroconductor 27 and a wiring 28. That is, unlike the structure in FIG. 1, an additional wiring 28 will be required in the same layer (height) as the wiring 15. With that wiring 28, the wiring layer decreases in the degree of freedom of layout to occasionally narrow an aperture of the photoelectric conversion element. However, in FIG. 1, no wiring is required at an occasion of electrically connecting the gate electrode 7 to the FD region 5. Therefore, the wiring layer increases in the degree of freedom of layout. Thus the aperture of the photoelectric conversion element can be widened. In addition, the wiring can be arranged in a desired region in a part of a region immediately above the first electroconductor over the second interlayer insulation layer. Thereby, shielding of the FD region 5 will become easy.

Moreover, improvement in aperture ratio will be described. FIG. 5A illustrates a plan layout view of a photoelectric conversion device with a first electroconductor (shared contact structure) electrically connected to the gate electrode of an amplifying MOS transistor. FIG. 5A corresponds to FIG. 6 in reference numeral and description thereon will be omitted. An FD region is electrically connected to the gate electrode of the amplifying MOS transistor 104 with the first electroconductor 9. There are a signal output line 106 and a power source line 107. Here, an active region 130 is electrically connected to a power source.

Figure 4:
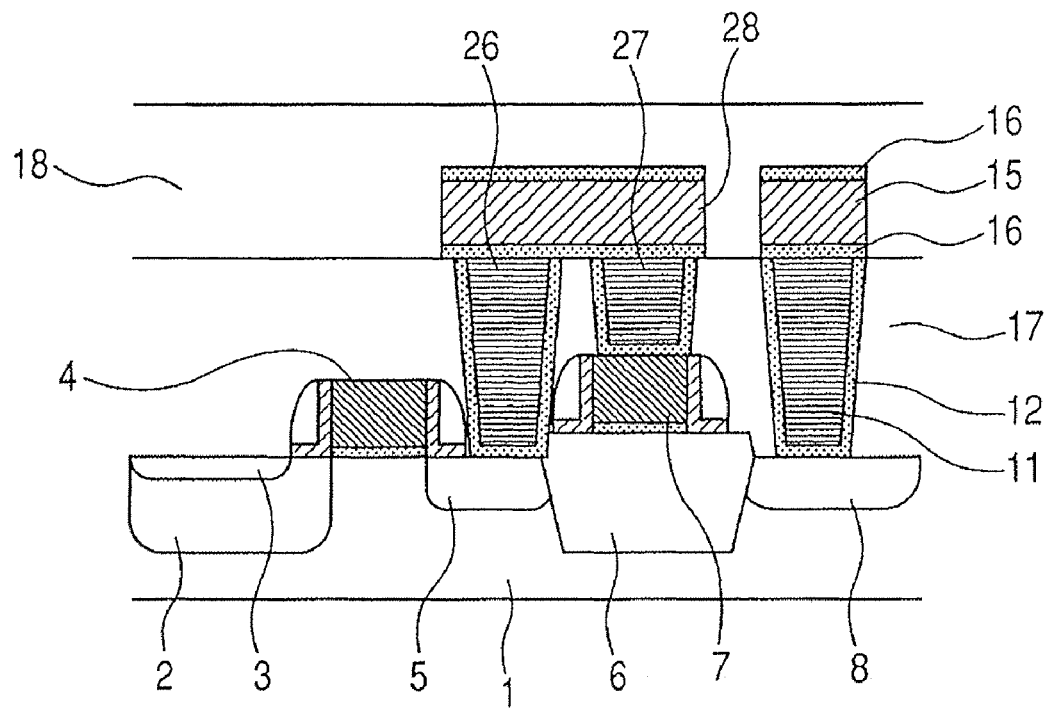
FIG. 4 is a schematic section of a photoelectric conversion device for comparison.

For the purpose of comparison, FIG. 5B illustrates a plan layout view of a photoelectric conversion device without any first electroconductor for bringing the gate electrode of the amplifying MOS transistor into electrical connection as in the constitution as in FIG. 4, for example. FIG. 6 likewise corresponds to FIG. 5A in reference numeral. FIG. 5B illustrates wiring 133 for bringing the signal output line 106, the power source line 107, the FD region and the gate electrode into electrical connection and there are more wiring in number per a pixel than in FIG. 5A. Consequently, by adapting the structure of the present embodiment, the wiring layer increases the degree of freedom in layout so that the aperture of the photoelectric conversion element can be widened. In addition, the wiring is arranged over the FD region. Thereby entrance of light into the FD region can be decreased. In the case where the wiring is not a drive line electrically connected to the gate electrode of the MOS transistor but one of the signal output line 106 and the power source line 107, the noise to the FD region due to variation in potential of the wiring can be decreased further.

Next, electrical connection structure in the portion besides the gate of the amplifying MOS transistor and the FD region will be described. The active region 8 inside a pixel is provided with the second an electroconductor for bringing the wiring in the upper portion into electrical connection.

That second electroconductor can also be formed of one electroconductor. Specifically, according to the method, after stacking the first interlayer insulation layer and the second interlayer insulation layer together, a hole is formed to pierce the first interlayer insulation layer and the second interlayer insulation layer to bury an electroconductor there. However, as described above, at the time of forming that hole, metal impurity can possibly diffuse into the active region 8. Therefore, in structure of the present embodiment, the third electroconductor 11 and the first electroconductor 9 on the substrate side are formed through the same step. Thereafter fourth electroconductor 13 is stacked over the third electroconductor. Thereby, entrance of metal impurity into the semiconductor region decreases and a photoelectric conversion device with less noise can be provided.

In addition, the third electroconductor and the first electroconductor approximately have the same height. Thereby, planarization of the second interlayer insulation layer arranged over those electroconductors can be simplified to enable the interlayer insulation layer to get thinner. In addition, incident light path to the photoelectric conversion element can be shortened.

(Manufacturing Method of Photoelectric Conversion Device)

Next, an example of a manufacturing method of a photoelectric conversion device will be described with FIGS. 2A, 2B, 2C and 2D. FIGS. 2A, 2B, 2C and 2D correspond to FIG. 1 in reference numeral.

Firstly, an element isolation region 6, a second electroconductor type semiconductor region 3, FD region 5 and the like are formed in a semiconductor region 1 of a first electroconductor type. Next, gate electrodes 4 and 7 made of polysilicon, for example, are formed on a semiconductor substrate to provide the sate where a photoelectric conversion element and a MOS transistor are formed in a semiconductor substrate. Thereafter, a first interlayer insulation layer 17 made of silicon oxide film is formed to provide a constitution of FIG. 2A.

Figure 2A:
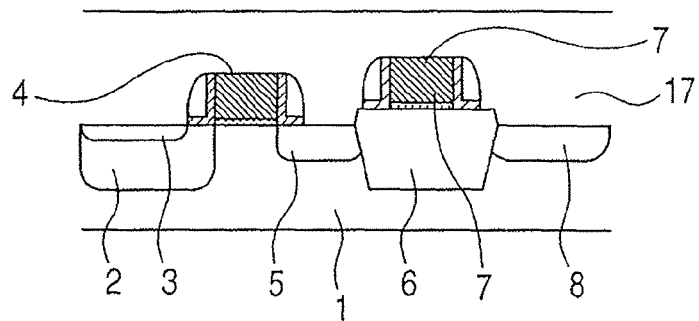
FIGS. 2A, 2B, 2C and 2D are schematic views illustrating manufacturing steps of a photoelectric conversion device.
Figure 2B:
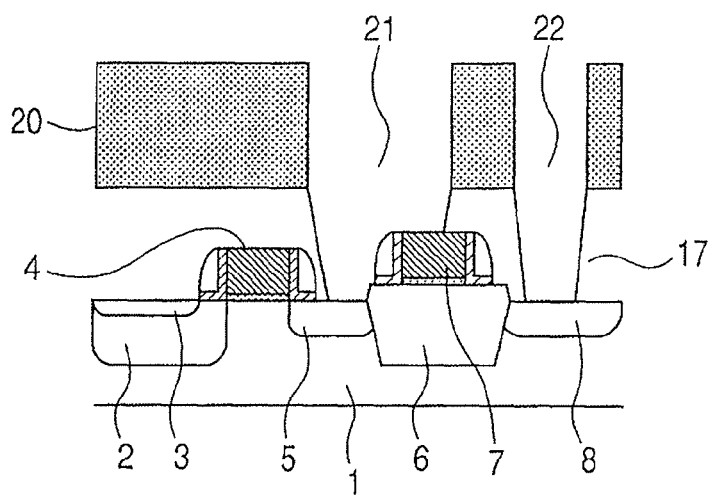
Figure 2C:
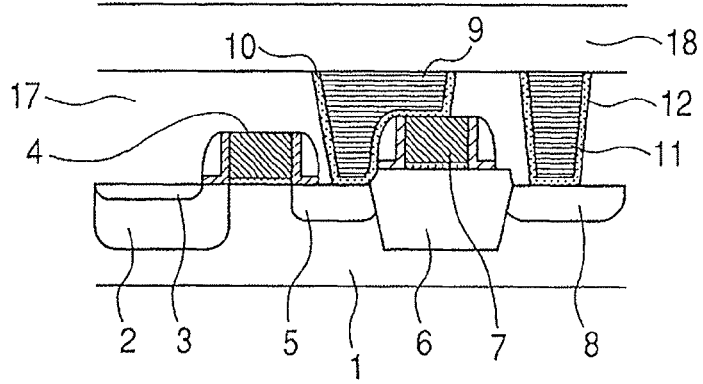

As illustrated in FIG. 2B, photoresist coated over the first interlayer insulation layer 17 undergoes patterning to form a resist pattern 20. With the resist pattern 20 as a mask, a hole 21 for the first electroconductor and a hole 22 for the third electroconductor are formed in the first interlayer insulation layer 17 by etching. As apparent from FIG. 2B, the hole 21 is a single hole corresponding to a region including a part of the gate electrode of an amplifying MOS transistor and a part of the FD region. In addition, as described above, the hole 22 is formed in a region corresponding to at least a part of one of the source and the drain regions being electrode regions of the read transistor. The shape of the hole can be for covering all the region of each electrode region. The shape can correspond to only the region of a part thereof. The read transistor is, for example, an amplifying MOS transistor.

After removing the resist pattern 20, film for forming barrier film 10 and 11 is formed. Moreover, metal film (tungsten film) for forming the first electroconductor 9 and the third electroconductor 11 is formed. Tungsten film is formed by, for example, a CVD method with $WF_6$ gas. Barrier film in the case where the electroconductor is tungsten includes Ti and TiN, for example. The barrier film can be one of a mono layer and a stacked layer. By etching back the barrier film and the metal film concurrently, the first electroconductor 9 and the third electroconductor 11 including barrier film 10 and 11 are formed. For that step, besides etching back, a CMP (Chemical Mechanical Polishing) method can be adopted. Such a step will enable the first electroconductor and the third electroconductor to have the same height. Thereafter, covering the first electroconductor 9, the third electroconductor 11 and the first interlayer insulation layer, the second interlayer insulation layer 18 is formed to give rise to a constitution of FIG. 2C.

Figure 2D:
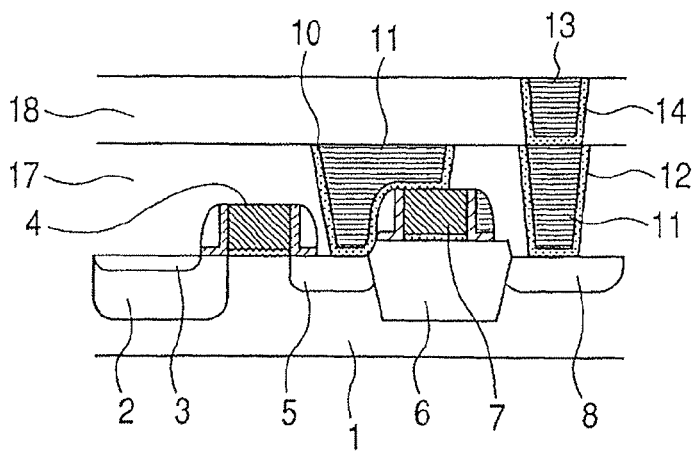

Next, over the second interlayer insulation layer 18, a resist pattern is formed again so that a hole for a fourth electroconductor is formed with the resist pattern as a mask. That hole is formed in a region corresponding to at least a part of the second electroconductor. Through the same step as the step in FIG. 2C, the fourth electroconductor 13 and barrier film 14 are formed (FIG. 2D).

Thereafter, wiring is formed. At first, barrier film, metal film for wiring and barrier film undergoes film forming and patterning in this order. Thereby, wiring 15 and barrier film 16 thereof are formed. The fourth electroconductor 13 is electrically connected to the wiring 15. The third interlayer insulation layer 19 is formed to give rise to the constitution of FIG. 1. Aluminum is adopted for the metal film of the wiring layer but copper can be adopted.

Figure 8A:
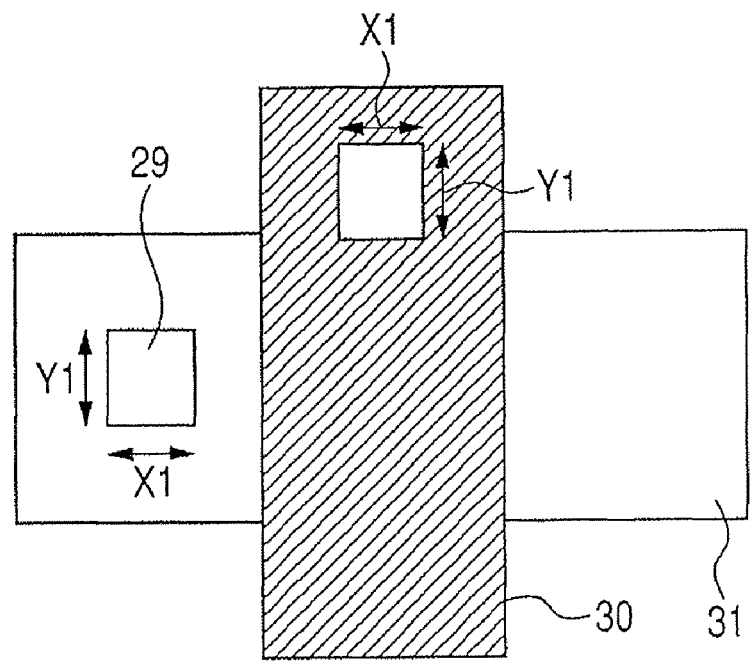
FIGS. 8A and 8B are plan layout views of a MOS transistor.
Figure 8B:
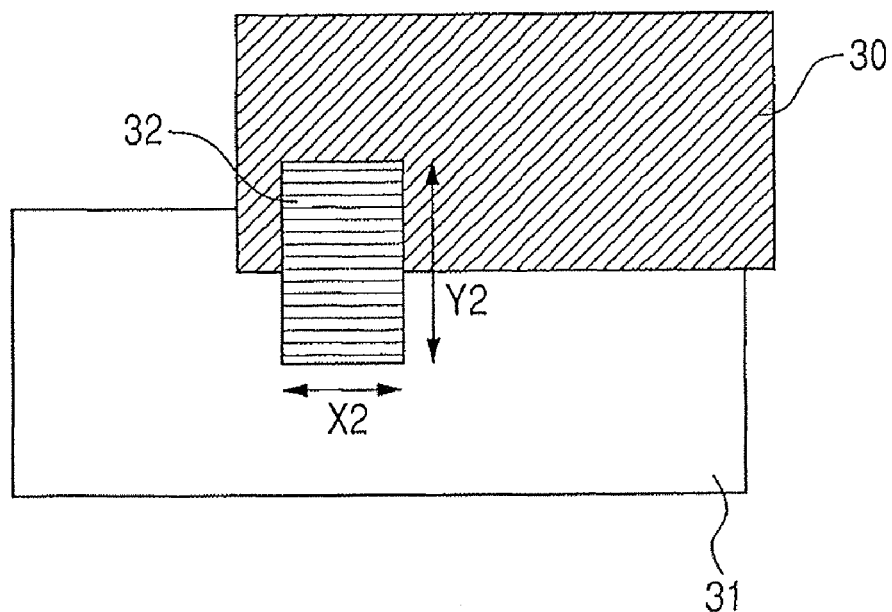

Here, the shape of the first electroconductor and the second electroconductor will be described with FIGS. 8A and 8B. FIG. 8A is a schematic plan view for describing the shape of the bottom plane of an electroconductor and includes a gate electrode 30 and an active region 31. A shape 29 of the bottom plane of a hole is arranged in the active region 31 and the gate electrode 30. In FIGS. 8A and 8B, the contact is approximately rectangular with a line having length X1 and the other line perpendicular thereto having length Y1. Otherwise there is a case of an oval shape. The length X1 is equivalent to the length Y1. FIG. 8B is a schematic plan view illustrating the bottom plane 32 of a hole in structure (shared contact structure) including the first electroconductor of FIG. 1. FIG. 8B corresponds to FIG. 8A in reference numeral. The bottom plane 32 of the hole is also approximately rectangular. In addition, an oval shape can be adopted. A line having length Y2 across the gate electrode 30 and the active region 31. The other line has length X2. The length Y2 is longer than the length X2. Here, the length X2 can be longer than the length X1. By stipulating the length thus, deterioration in electroconductivity can be restrained and connection defects can be decreased.

In the present embodiment, a first electroconductor 9 arranged in an aperture arranged in the first interlayer insulation layer 17, and a third electroconductor are formed concurrently. Thereby diffusion of metal impurity to the substrate can be reduced. Thereby, a high quality photoelectric conversion device with less noise can be provided. In addition, in the present embodiment, the second electroconductor electrically connects the active region 8 to the wiring layer. However, structure of that second electroconductor is also applicable to electrical connection between a gate electrode of a MOS transistor different from an amplifying MOS transistor and the wiring layer.

Second Embodiment

Figure 3:
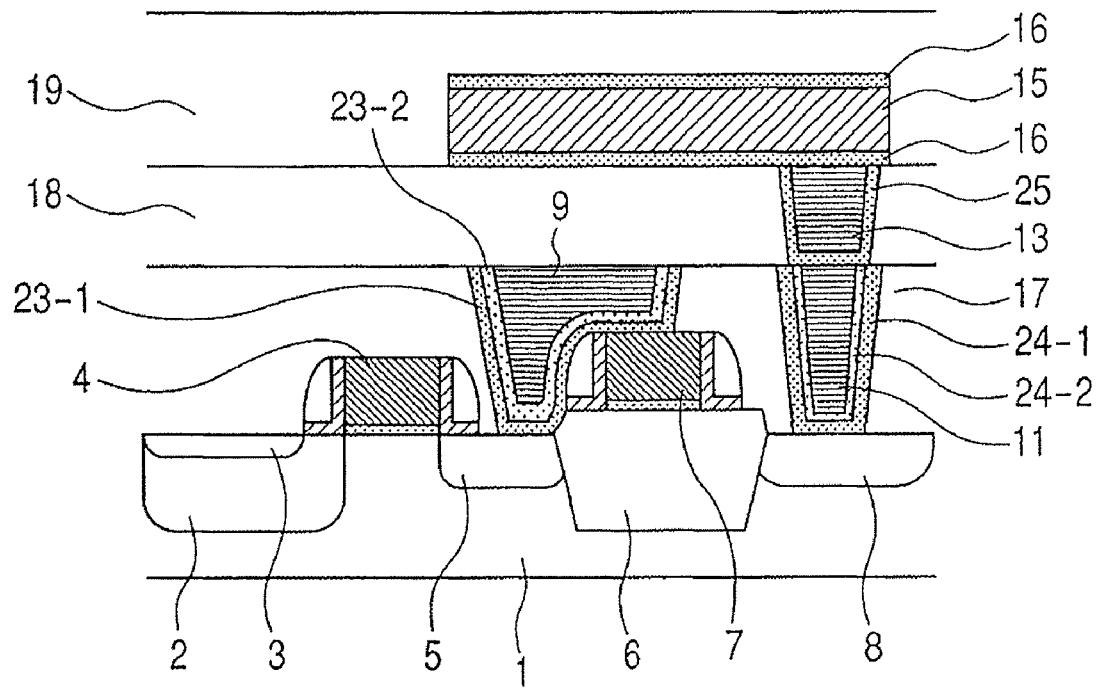
FIG. 3 is a schematic section of a photoelectric conversion device of a second embodiment.

Constitution of the present embodiment is illustrated in FIG. 3. FIG. 3 corresponds to FIG. 1 in reference numeral. The present embodiment features structure of barrier film included in the second electroconductor. Barrier films 24-1 and 24-2 are provided between the third electroconductor 11 and the active region 8. Barrier film 25 is provided between the fourth electroconductor 13 and the third electroconductor. The structure can be formed by providing a step for forming dual layered barrier film in a hole prior to a step for arranging the first electroconductor and the third electroconductor and adding a step for forming a mono layered barrier film in a hole prior to a step for arranging the fourth electroconductor. For example, in case of using tungsten as an electroconductor, barrier film of the first electroconductor 9 and the third electroconductor 11 is dual layered structure of Ti film and TiN film and barrier film of the fourth electroconductor 13 is a mono layered TiN film. That constitution enables improvement in yield factor of a photoelectric conversion device including structure as the second electroconductor.

In structure as the second electroconductor, barrier film of the third electroconductor 11 in the lower layer is dual layered structure of Ti film 24-1 being adhesive to Si and TiN film 24-2 being resistant to $WF_6$. Such constitution will enable improvement in reliability of barrier film and decrease in diffusion of tungsten. However, the fourth electroconductor 13 in the upper layer includes only TiN resistant to $WF_6$. In that case, compared with the case of dual layered structure of Ti film and TiN film, thick TiN film can be arranged and therefore coating ratio can be improved to enable reduction in abnormal growth of tungsten and erosion of barrier film.

Here, abnormal growth of tungsten and erosion of barrier film will be described further in detail. At an occasion of forming, in the second interlayer insulation layer 18, a contact hole for the fourth electroconductor 13 in the upper layer, the center of the hole is occasionally displaced from the center of the third electroconductor 11. At that occasion, insufficient coating is apt to occur in a portion of barrier film. Accordingly, adopting stacked structure of Ti film and TiN film also for the barrier film of the upper layer, coating of TiN film will become insufficient and resistance to $WF_6$ will become insufficient. And there may occur the case where and $WF_6$ erodes barrier film of Ti and the case where tungsten grows abnormally. Accordingly, the barrier film in the upper layer can be a mono layered structure of TiN film excellently resistant to $WF_6$. Such constitution can make TiN thicker than the case where a plurality of layers is provided and enables erosion of barrier film and occurrence of abnormal growth of tungsten to be reduced. Accordingly, the yield factor of a photoelectric conversion device including the contact of the stacked structure can be improved. Here, material lower than $WF_6$ in reactivity is selected from the group including of TaN, WSi, WN and the like.

Third Embodiment

The present embodiment stipulates a ratio of a length of a region arranged at a part of the area just above the gate electrode of the amplifying MOS transistor of the first electroconductor (shared contact structure) and a length of a region arranged at a part of the area just above an active region of the first electroconductor. That length stipulation will be described with FIG. 9 and FIG. 10.

Figure 9:
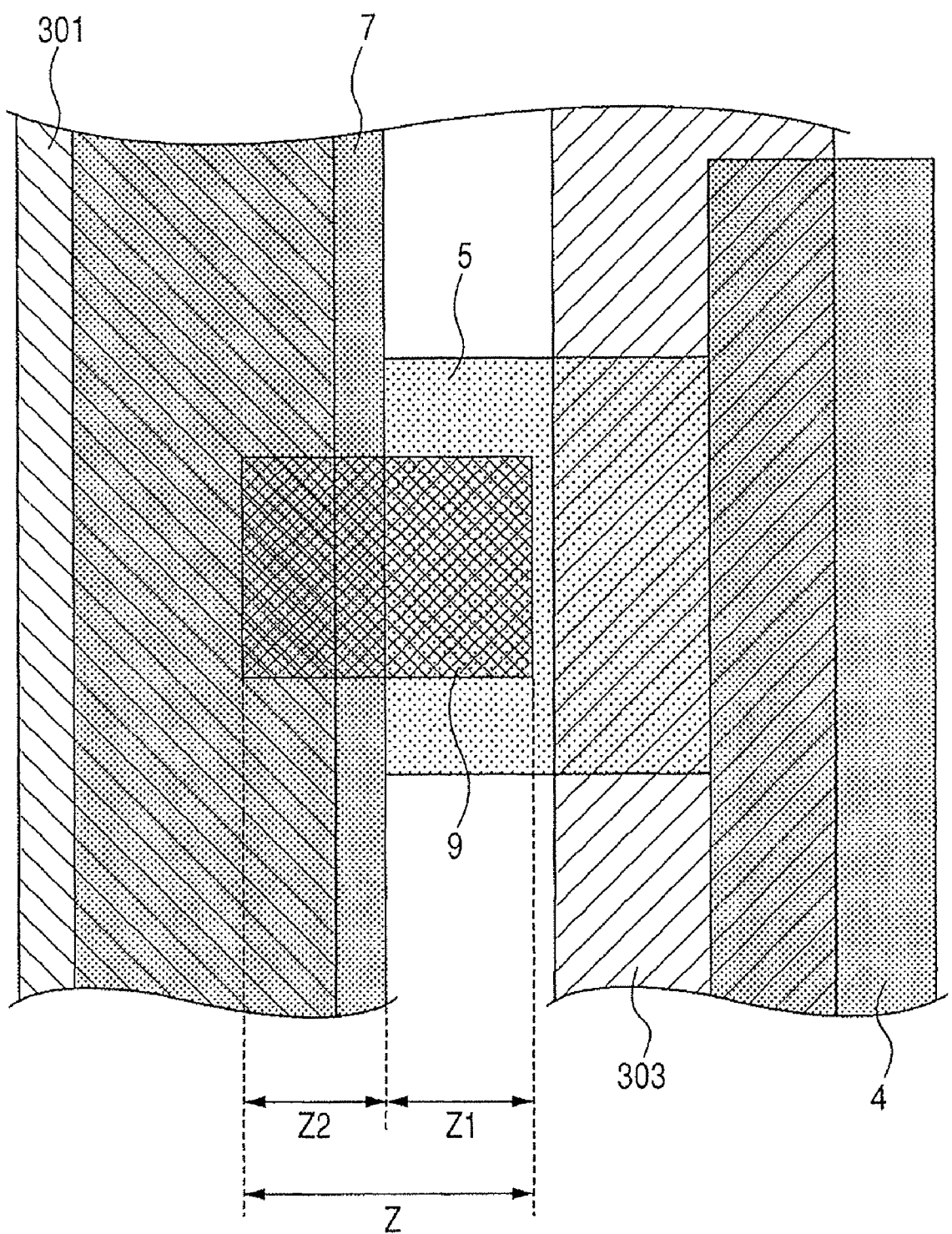
FIG. 9 is a plan layout view on a first electroconductor.

FIG. 9 is a plan view illustrating the bottom plane of the first electroconductor subjected to enlargement in a portion where the first electroconductor 9 is formed in FIG. 5A. FIG. 9 corresponds to FIG. 1 in reference numeral. FIG. 9 illustrates wirings 301 and 303. Those wirings correspond to the signal line 106 and the power source line 107. The first electroconductor 9 includes a first region arranged at a part of the area just above the gate electrode of the amplifying MOS transistor and a second region arranged at a part of the area just above an FD region 5. In FIG. 9, the lengths of the first and the second regions parallel in a direction crossing a boundary between those first and second regions are Z1 and Z2 respectively. The lengths Z1 and Z2 are length in the longitudinal direction in a planar shape of the first electroconductor.

Here, in view from the top, the first electroconductor is substantially shaped rectangular with longer lines in a direction crossing a boundary between the gate electrode 7 and the FD region 5. Shorter lines of the first electroconductor are substantially parallel to a boundary between the gate electrode 7 and the FD region 5. With such a relation, also in a site where arrangement of line and space in the design rule, a sufficient contact area can be secured for the gate electrode 7 and the FD region 5. Here, the first electroconductor in view from the top can be shaped oval and the like.

Figure 10:
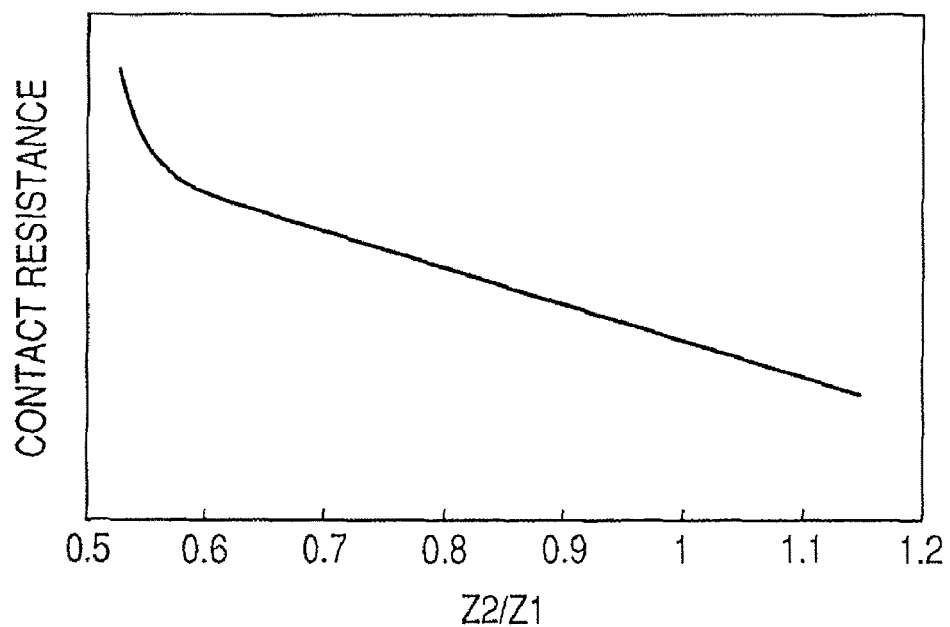
FIG. 10 is a graph on contact resistance.

FIG. 10 is a graph illustrating the relation between contact resistance and the ratio of the lengths of the first and second regions of the first electroconductor illustrated in FIG. 9. The ratio Z2/Z1 is the ratio of the lengths of the first and second regions of the first electroconductor, that is, in other words, a percentage of the area of the second region to the area of the first region. The ratio Z2/Z1 in FIG. 10 illustrates changes in the length Z2 with Z1 being a constant value. Specifically, changes in contact resistance are illustrated in the case where the length Z1 is fixed at 0.28 and the value of the length Z2 is changed. As illustrated in FIG. 10, with the ratio Z2/Z1 being 0.6 and more, it is apparent that the contact resistance decreases linearly as the ratio Z2/Z1 increases. That is, as the contact areas of the first electroconductor and the gate electrode 7 gets larger than the contact area of the first electroconductor to the FD region 5, the contact resistance decreases linearly.

On the other hand, with the ratio Z2/Z1 being less than 0.6, it is apparent that the contact resistance increases sharply as the ratio Z2/Z1 decreases. That is, as the contact areas of the first electroconductor and the gate electrode 7 gets smaller than the contact area of the first electroconductor to the FD region 5, the contact resistance increases sharply.

A photoelectric conversion device forms an image with information of the two-dimensionally arranged pixel. Accordingly the properties of each pixel are desired to be uniform. However, variation and the like at manufacturing occasionally gives rise to variation in size of the bottom plane of the first electroconductor in each pixel. That is, in the case of the ratio Z2/Z1 being less than 0.6, a little variation at manufacturing even gives rise to significant variation in contact resistance. Even if a uniform light amount is irradiated over the whole pixels, in the case where there is significant variation in contact resistance of the first electroconductor, voltage applied to the gate electrode of the amplifying MOS transistor will give rise to variation. Therefore, variation in the output of each pixel occurs to occasionally coarsen an image to be obtained. In contrast, with the ratio Z2/Z1 being 0.6 and more, even if likewise variation occurs at manufacturing, variation in contact resistance is small and therefore variation in output of each pixel can be decreased.

In addition, with the ratio Z2/Z1 being less than 1, displacement at manufacturing can restrain the case where the first electroconductor occasionally forms beyond the gate electrode 7. An occurrence of the first electroconductor going beyond the width of the gate electrode 7 is not desired since possibility of contact to the active region of another element increases. A margin must be considered at designing and, therefore, miniaturization will become difficult. Accordingly, the ratio Z2/Z1 is desired to be 0.6-1. Moreover, in the case of considering an alignment margin to the gate electrode in lithographical step at manufacturing an electroconductor and a size margin of patterning, the ratio Z2/Z1 is desired to be 0.7 or more. Thereby contact resistance is stabilized and the control of the process becomes easy.

As described above, structure of the first electroconductor illustrated in the present embodiment enables miniaturization without decreasing electrical properties.

Fourth Embodiment

Figure 11:
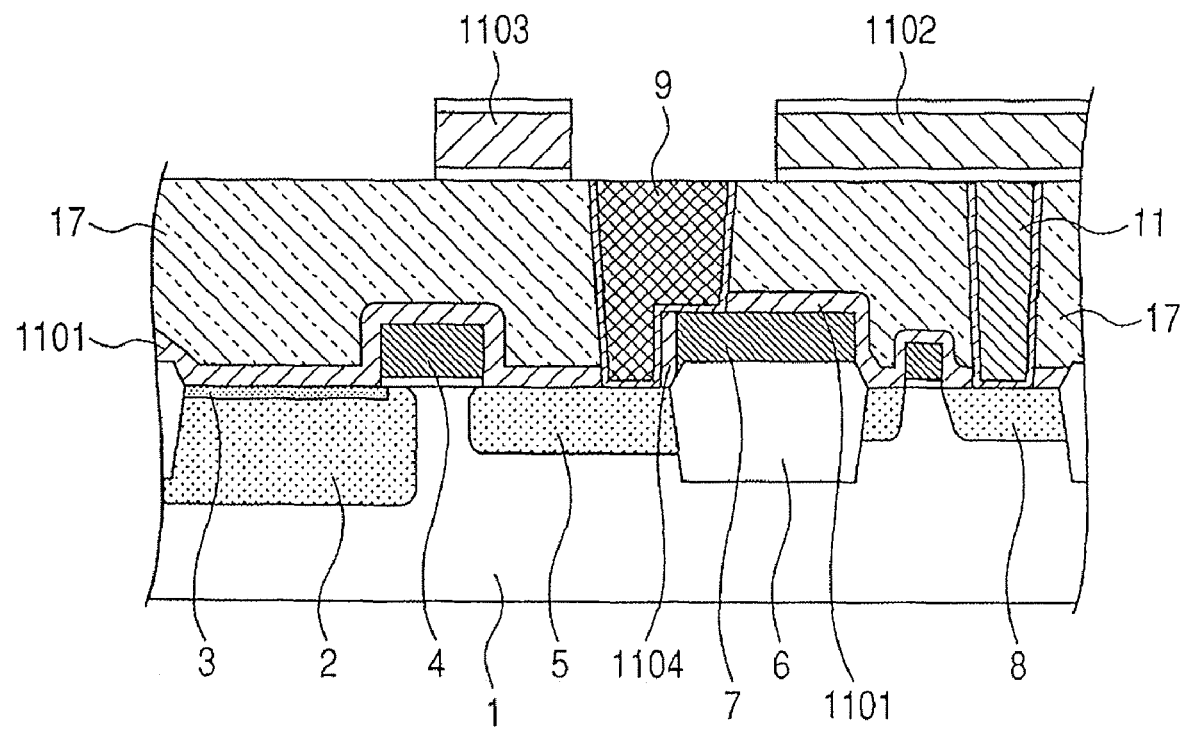
FIG. 11 is a schematic section of a photoelectric conversion device of a fourth embodiment.

A constitution of a photoelectric conversion device of the present embodiment will be described with FIG. 11. FIG. 11 is further provided with a reflection preventing film 1101 in addition to the constitution in FIG. 1. In addition, a wiring 1102 is arranged over the third electroconductor 11 and a wiring 1103 is arranged on the same layer. The reflection preventing film 1101 can be used as etching stop film at forming a hole so that a hole can be formed in a well-controlled manner. In addition, arranging a wiring 1102 and a wiring 1103 in the layer over the third electroconductor 11. Thereby the height can be made lower.

In addition, the gate electrode 7 includes a side wall 1104 including the reflection preventing film 1101. At that occasion, in size of the bottom plane of the first electroconductor, the length of the region coming into connection to the side wall 1104 can be included in the above described length Z1.

(Application to Image Pickup System)

Figure 7:
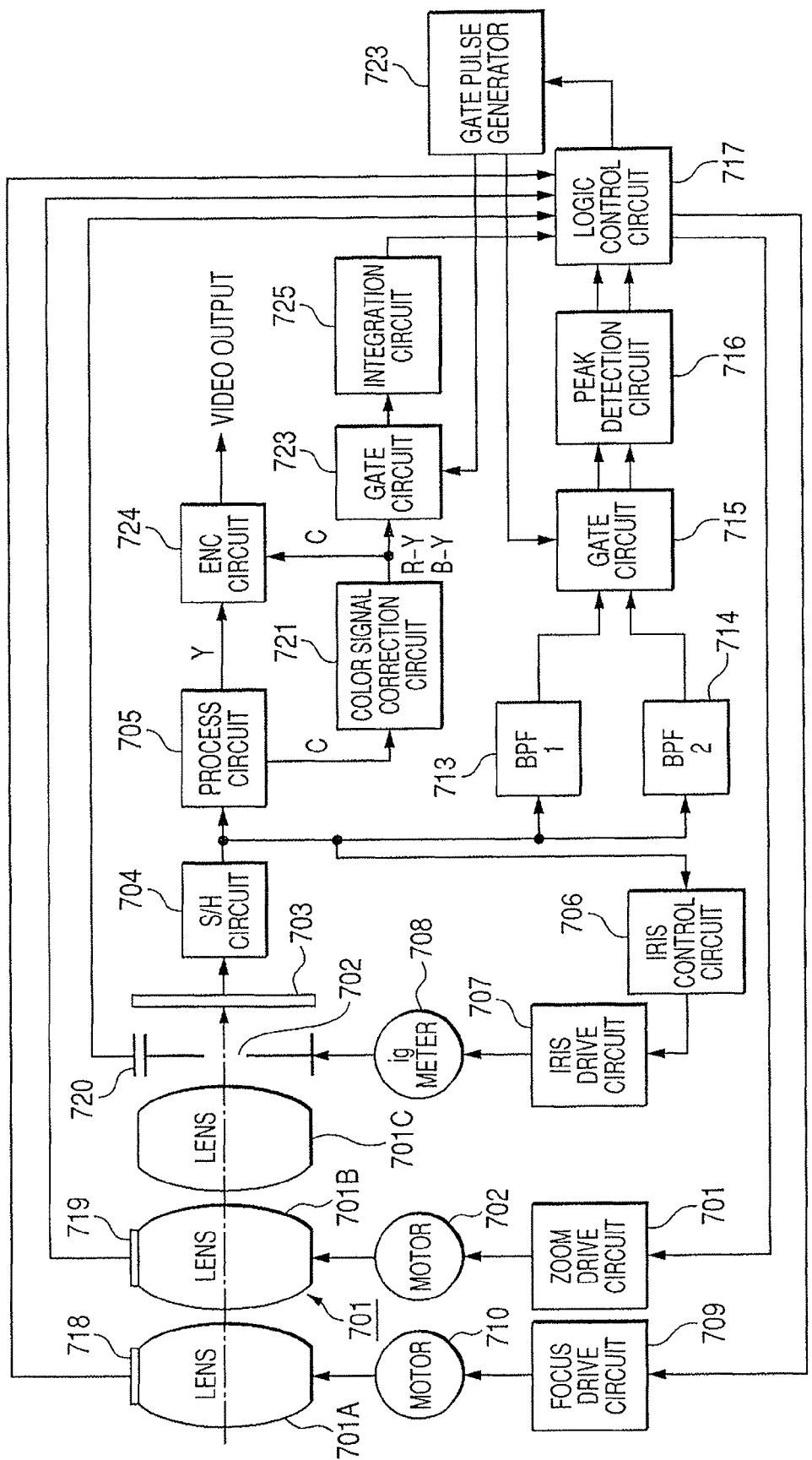
FIG. 7 is a block diagram of an example of an image pickup system.

FIG. 7 is a block diagram in the case of applying a photoelectric conversion device described with the above described embodiment to a video camera being an example of an image pickup system. Another image pickup system is a digital still camera and the like. Details will be described below based on FIG. 7.

An image pickup lens 701 includes a focus lens 701A for adjusting focus, a zoom lens 701B for zooming and a lens 701c for providing an image. The optical system includes an image pickup lens 701 and a diaphragm and a shutter 702. There is a photoelectric conversion device 703 which is described in each embodiment. A sampling and holding circuit (S/H circuit) 704 samples and holds output signals from the photoelectric conversion device 703 and moreover amplifies the level thereof to output video signals.

Video signals output from the sampling and holding circuit 704 undergo a predetermined treatment selected from the group including of gamma correction, color separation, blanking treatment and the like with a process circuit 705, which outputs a luminance signal Y and a chroma signal C. A chroma signal C output from the process circuit 705 undergoes correction in white balance and color balance with a color signal correction circuit 721 and is output as chrominance difference signals R-Y and B-Y. In addition, the luminance signal Y output from the process circuit 705 and chrominance difference signals R-Y and B-Y output from the color signal correction circuit 721 are modulated in an encoder circuit (ENC circuit) 724 and output as standard television signal and is supplied to an electronic view finder such as one of a video recorder not illustrated in the drawing and a monitor electronic view finder (EVF). That process circuit 705 and the like are regarded as a signal processing circuit.

Subsequently, an iris control circuit 706 controls an iris drive circuit 707 based on video signals supplied from the sample hold circuit 704. The iris control 706 automatically controls an ig meter 708 to control the aperture amount of a diaphragm 702 so that the level of the video signal gets to a constant value of a predetermined level.

Band-pass filters (BPF) 713 and 714 extract a high frequency component necessary for carrying out focus detection from the video signal output from the sampling and holding circuit 704. Signals output from the first band-pass filter 713 (BPF 1) and the second band-pass filter 714 (BPF 2) provided with respectively different band limits are held by a focus gate frame in the gate circuit 715. And a peak value is detected and held by the peak detection circuit 716 and simultaneously input to a logic control circuit 717. That signal will be called focus voltage. The focus is adjusted with that focus voltage.

In addition, a focus encoder 718 detects a moving location of a focus lens 701A. A zoom encoder 719 detects a focus of a zoom lens 701B. An iris encoder 720 detects an aperture amount of the diaphragm 702. The detected values of those encoders are supplied to the logic control circuit 717 which carries out system control.

The logic control circuit 717 carries out focus detection on a subject to adjust focus based on the video signal corresponding to inside a set focus detection region. That is, peak value information of high frequency component supplied from the respective band-pass filters 713 and 714 is taken in. Thereafter, the focus lens 701A is driven to a position where the peak value of the high frequency component is maximized. Therefore, the focus drive circuit 709 is provided with a control signal selected from the group including of a rotation direction, a rotation velocity, one of rotation and halting and the like of the focus motor 710 to control that focus motor 710.

The zoom drive circuit 711 rotates the zoom motor 712 when zooming is instructed. When the zoom motor 712 rotates, the zoom lens 701B moves to carry out zooming.

Use of the photoelectric conversion device of the present invention which increases incident light amount to a photoelectric conversion element and has less noise in such an image pickup system can provide an image pickup system with good signal-to-noise ratio.

And described above, the present invention can provide a more high quality photoelectric conversion device and a more high quality image pickup system. In addition, the material and the manufacturing method selected from the group including of electroconductive type of a semiconductor substrate, a constitution of a pixel, a wiring layout and, otherwise, a stacking number of the second electroconductor and the like will not be limited to the respective embodiments but will be appropriately set.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-235936, filed Aug. 31, 2006, No. 2006-236760, filed Aug. 31, 2006, and No. 2007-189447, filed Jul. 20, 2007, which are hereby incorporated by reference herein in their entirety.

What is claimed is:

1. A photoelectric conversion device comprising:
a photoelectric conversion element;
a plurality of MOS transistors including a transfer MOS transistor for transferring an electric carrier from the photoelectric conversion element to a first semiconductor region and an amplifying MOS transistor for outputting a signal based on the electric carrier transferred;
a wiring layer including a plurality of wirings;
a plurality of interlayer insulation layers including a first interlayer insulation layer covering the photoelectric conversion element and the plurality of MOS transistors and a second interlayer insulation layer laminated on the first interlayer insulation layer;
a first electroconductor; and
a second electroconductor including a third electroconductor and a fourth electroconductor,
wherein the first electroconductor is buried in a first hole formed in the first interlayer insulation layer for electrically connecting the first semiconductor region to a gate electrode of the amplifying MOS transistor but not through the plurality of wirings included in the wiring layer,
wherein the third electroconductor is buried in a second hole formed in the first interlayer insulation layer and the fourth electroconductor is buried in a third hole formed in the second interlayer insulation layer, the third electroconductor and the fourth electroconductor being in a stacked arrangement and being electrically connected to each other for electrically connecting a second semiconductor region different from the first semiconductor region to a first wiring included in the wiring layer, and
wherein the first electroconductor and the second electroconductor have a barrier metal.

2. The photoelectric conversion device according to claim 1, wherein the first and third electroconductors have a same height.

3. The photoelectric conversion device according to claim 1, further comprising a fifth electroconductor and a sixth electroconductor, wherein
the fifth electroconductor is buried in a fourth hole formed in the first interlayer insulation layer and the sixth electroconductor is buried in a fifth hole formed in the second interlayer insulation layer, and
the fifth and sixth electroconductors are in a stacked arrangement and are electrically connected to each other and electrically connect a second wiring included in the wiring layer to a gate electrode of a MOS transistor included in the plurality of MOS transistors, the MOS transistor being different from the amplifying MOS transistor.

4. The photoelectric conversion device according to claim 1, wherein the second semiconductor region forms one or more electrode regions of the plurality of MOS transistors.

5. The photoelectric conversion device according to claim 1, wherein the first and third electroconductors have a dual layered barrier film and the fourth electroconductor has a mono layered barrier film.

6. The photoelectric conversion device according to claim 5,
wherein the first, third, and fourth electroconductors are formed from tungsten, and
wherein the mono layered barrier film is formed from any one of: titanium nitride, tantalum nitride, tungsten nitride, and tungsten silicide.

7. The photoelectric conversion device according to claim 1, wherein the wiring layer further includes a third wiring arranged in at least a part of an area just above the first electroconductor over the second interlayer insulation layer.

8. The photoelectric conversion device according to claim 7, wherein the third wiring is a power supplying line for supplying a power voltage to the amplifying MOS transistor, or a signal line through which the signal is outputted from the amplifying MOS transistor.

9. The photoelectric conversion device according to claim 1, wherein the first electroconductor includes a first region arranged at an area just above the first semiconductor region and a second region arranged at an area just above the gate electrode of the amplifying MOS transistor, such that a ratio of a length of the first region to a length of the second region in a direction crossing a boundary between the first and second regions is 0.6 to 1.

10. The photoelectric conversion device according to claim 9, wherein the ratio is 0.7 to 1.

11. The photoelectric conversion device according to claim 1,
wherein the gate electrode is arranged so that a part of the gate electrode is disposed over an element isolation region, and wherein the element isolation region is formed from STI.

* * * * *